(12) United States Patent
Oomori et al.

(10) Patent No.: US 6,245,930 B1
(45) Date of Patent: *Jun. 12, 2001

(54) CHEMICAL-SENSITIZATION RESIST COMPOSITION

(75) Inventors: Katsumi Oomori, Yokohama; Hideo Hada; Fumitake Kaneko, both of Hiratsuka, all of (JP); Mitsuru Sato, Hillsboro, OR (US); Kazufumi Sato, Sagamihara; Toshimasa Nakayama, Chigasaki, both of (JP)

(73) Assignee: Tokyo Ohka Kogyo Co., Ltd., Kanagawa-ken (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 46 days.

(21) Appl. No.: 09/317,208

(22) Filed: May 24, 1999

Related U.S. Application Data

(62) Division of application No. 08/898,105, filed on Jul. 22, 1997, now Pat. No. 5,976,760.

(30) Foreign Application Priority Data

Jul. 24, 1996 (JP) .................................................. 8-195100
Jan. 24, 1997 (JP) .................................................. 9-11580

(51) Int. Cl.$^7$ ................................................ C07C 255/00
(52) U.S. Cl. ........................... 558/301; 549/75; 549/491
(58) Field of Search ............................ 558/301; 549/75, 549/491; 564/248, 254

(56) References Cited

U.S. PATENT DOCUMENTS

| 4,123,255 | 10/1978 | Freenor, III et al. ............... 71/103 |
|---|---|---|
| 4,451,286 | 5/1984 | Martin ................................. 71/107 |
| 4,540,598 | 9/1985 | Berner et al. ...................... 427/54.1 |
| 4,736,055 | 4/1988 | Dietliker et al. ..................... 560/13 |
| 5,019,488 | 5/1991 | Mammato et al. ................. 430/325 |
| 5,216,135 | 6/1993 | Urano et al. ........................ 534/556 |
| 5,627,011 | 5/1997 | Münzel et al. ................... 430/270.1 |
| 5,800,964 | 9/1998 | Sato et al. ....................... 430/281.1 |
| 6,017,675 * | 1/2000 | Dietliker et al. ................ 430/270.1 |

FOREIGN PATENT DOCUMENTS

| 0 044 115 | 1/1982 | (EP) . |
|---|---|---|
| 0 361 907 | 4/1990 | (EP) . |
| 1-124848 | 5/1989 | (JP) . |

* cited by examiner

*Primary Examiner*—Janet Baxter
*Assistant Examiner*—Rosemary Ashton
(74) *Attorney, Agent, or Firm*—Wenderoth, Lind & Ponack, L.L.P.

(57) ABSTRACT

Proposed is a novel chemical-sensitization resist composition capable of giving a positively or negatively patterned resist layer of excellent pattern resolution and cross sectional profile of the patterned resist layer with high sensitivity. Characteristically, the resist composition is formulated, as combined with a resinous ingredient which is subject to changes in the solubility behavior in an alkaline developer solution by interaction with an acid, with a specific oxime-sulfonate compound as the radiation-sensitive acid-generating agent represented by the general formula $$R^1-C(CN)=N-O-SO_2-R^2,$$

in which $R^1$ is an inert organic group and $R^2$ is an unsubstituted or substituted polycyclic monovalent hydrocarbon group selected from the group consisting of polycyclic aromatic hydrocarbon groups such as naphthyl and polycyclic non-aromatic hydrocarbon groups such as a terpene or camphor residue.

7 Claims, No Drawings

CHEMICAL-SENSITIZATION RESIST COMPOSITION

This application is a division of Ser. No. 08/898,105.

BACKGROUND OF THE INVENTION

The present invention relates to a novel chemical-sensitization resist composition or, more particularly, to a chemical-sensitization resist composition, which may be positive-working or negative-working, capable of giving a patterned resist layer having an excellently orthogonal cross sectional profile with high sensitivity and high pattern resolution.

It is a trend in recent years that the photolithographic patterning works in the manufacture of semiconductor devices, liquid crystal display panels and the like are conducted by using a chemical-sensitization resist composition. The working principle of the chemical-sensitization resist composition is that the solubility behavior of the resist layer in an alkaline developer solution is changed in the pattern-wise exposed areas by the catalytic activity of an acid generated from an acid-generating agent contained in the resist composition by the exposure to light. Chemical-sensitization resist compositions in general have an advantage of high sensitivity because good latent images can be formed even with a low exposure dose when the acid-generating agent has a high efficiency for radiation-induced generation of an acid.

Chemical-sensitization resist compositions are classified into positive-working and negative-working compositions, each of which comprises an acid-generating agent capable of releasing an acid by irradiation with actinic rays and a film-forming resinous ingredient which is subject to a change in the solubility in an aqueous alkaline solution by the interaction with an acid.

In the positive-working chemical-sensitization resist compositions, the film-forming resinous ingredient most widely under current use is a polyhydroxystyrene substituted for a part of the hydroxyl groups by acid-dissociable solubility-reducing groups such as tert-butoxycarbonyl groups, tetra-hydropyranyl groups and the like so as to be rendered insoluble in an aqueous alkaline solution. On the other hand, the negative-working chemical-sensitization resist compositions are formulated, as the film-forming resinous ingredient, with a combination of an alkali-soluble resin such as a novolak resin and polyhydroxystyrene resin optionally substituted for a part of the hydroxyl groups by the above mentioned solubility-reducing groups and an acid-crosslinkable compound such-as melamine resins, urea resins and the like.

It is known to employ an oximesulfonate compound as the acid-generating agent in a chemical-sensitization resist composition as is disclosed in Japanese Patent Kokai 1-124848, 2-154266, 2-161444 and 6-17433. The oximesulfonate compounds disclosed there include those having a cyano group in the molecule such as α-(p-toluenesulfonyloxyimino)phenyl acetonitrile,
α-(p-chlorobenzenesulfonyloxyimino)phenyl acetonitrile,
α-(4-nitrobenzenesulfonyloxyimino)phenyl acetonitrile,
α-(4-nitro-2-trifluoromethylbenzenesulfonyloxyimino) phenyl acetonitrile,
α-(benzenesulfonyloxyimino)-4-chlorophenyl acetonitrile,
α-(benzenesulfonyloxyimino)-2,4-dichlorophenyl acetonitrile,
α-(benzenesulfonyloxyimino)-2,6-dichlorophenyl acetonitrile,
α-(benzenesulfonyloxyimino)-4-methoxyphenyl acetonitrile,
α-(2-chlorobenzenesulfonyloxyimino)-4-methoxyphenyl acetonitrile,
α-(benzenesulfonyloxyimino)-2-thienyl acetonitrile,
α-(4-dodecylbenzenesulfonyloxyimino)phenyl acetonitrile,
α-(4-toluenesulfonyloxyimino)-4-methoxyphenyl acetonitrile,
α-(4-dodecylbenzenesulfonyloxyimino)-4-methoxyphenyl acetonitrile,
α-(4-toluenesulfonyloxyimino)-3-thienyl acetonitrile, and the like.

As is taught in Japanese Patent Kokai 2-154266, these oximesulfonate compounds having a cyano group in the molecule can release an acid by the energy of various kinds of actinic rays such as deep ultraviolet light, electron beams, ion beams, X-rays and the like and, when a positive-working chemical-sensitization resist composition comprising such an oximesulfonate compound and a film-forming resinous ingredient in combination is subjected to patterning by electron beam scanning, a patterned resist layer of about 0.35 μm diameter in a hole pattern can be obtained. Also, a photocured patterned resist layer can be obtained from a negative-working chemical-sensitization resist composition comprising the oximesulfonate compound and a combination of a resin and an acid-crosslinkable compound by patterning with deep ultraviolet light.

In the manufacturing process of semiconductor devices in recent years with a rapidly proceeding trend toward a higher and higher degree of integration requiring ultrafine photolithographic patterning works, the above mentioned resist compositions are no longer quite satisfactory in several respects. Accordingly, a further improved chemical-sensitization resist composition capable of giving a patterned resist layer of an excellent cross sectional profile with a further improved pattern resolution and still with a high sensitivity is eagerly desired.

SUMMARY OF THE INVENTION

The present invention accordingly has an object, in view of the above mentioned problems and disadvantages in the prior art resist compositions, to provide a novel and improved chemical-sensitization resist composition, which may be positive-working or negative-working, capable of giving a patterned resist layer of high pattern resolution having an excellently orthogonal cross sectional profile with high sensitivity.

Thus, the chemical-sensitization resist composition provided by the present invention comprises, as a uniform solution in an organic solvent:

(A) 100 parts by weight of a film-forming resinous ingredient subject to changes in the solubility in an aqueous alkaline solution by interacting with an acid; and (B1) from 0.5 to 20 parts by weight of an acid-generating agent capable of releasing an acid by exposure to actinic rays, which is an oximesulfonate compound having a cyano group in the molecule represented by the general formula $$R^1\text{—C(CN)=N—O—SO}_2\text{—}R^2, \tag{I}$$

in which $R^1$ is an inert organic group and $R^2$ is an unsubstituted or substituted polycyclic monovalent hydrocarbon group including polycyclic aromatic hydrocarbon groups and polycyclic non-aromatic hydrocarbon groups, as an acid-generating agent.

In a second aspect of the invention, the acid-generating agent as the component (B2) in the chemical-sensitization resist composition is a combination of the oximesulfonate compound of the general formula (I) defined above and an onium salt compound.

In a third aspect of the invention, the acid-generating agent as the component (B3) in the chemical-sensitization resist composition is a combination of the oximesulfonate compound of the general formula (I) above and a second oximesulfonate compound having a cyano group in the molecule represented by the general formula

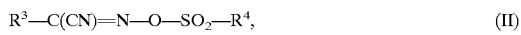

$$R^3\text{—}C(CN)\text{=}N\text{—}O\text{—}SO_2\text{—}R^4, \quad (II)$$

in which $R^3$ is an unsubstituted or substituted monovalent hydrocarbon group selected from unsaturated or saturated non-aromatic hydrocarbon groups and aromatic cyclic hydrocarbon groups and $R^4$ is an unsubstituted or substituted, unsaturated or saturated monovalent non-aromatic hydrocarbon group, or a third oximesulfonate compound having two or three cyano groups in the molecule represented by the general formula

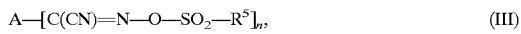

$$A\text{—}[C(CN)\text{=}N\text{—}O\text{—}SO_2\text{—}R^5]_n, \quad (III)$$

in which n is 2 or 3, $R^5$ is an unsubstituted or substituted monovalent hydrocarbon group and A is a divalent or tervalent, when n is 2 or 3, respectively, organic group.

DETAILED DESCRIPTION OF THE PREFERRED EMBODIMENTS

As is described above, the most characteristic feature of the inventive resist composition consists in the use of one or more of very specific oximesulfonate compounds, optionally, in combination with an onium salt compound as the radiation-sensitive acid-generating agent.

The component (A) as one of the essential ingredients in the chemical-sensitization resist composition of the present invention is a film-forming resinous material which is not particularly limitative. Namely, this component can be any one of those conventionally formulated in the positive-working or negative-working chemical-sensitization resist compositions of the prior art.

When the inventive resist composition is positive-working, the component (A) is an alkali-soluble hydroxyl group-containing resin rendered alkali-insoluble by substitution of acid-dissociable protective groups for at least a part of the hydroxyl groups. When the inventive resist composition is negative-working, the component (A) is a combination of an alkali-soluble hydroxyl group-containing resin optionally substituted by acid-dissociable protective groups for a part of the hydroxyl groups and an acid-crosslinkable compound capable of being crosslinked by the interaction with an acid.

When a layer of the positive-working chemical-sensitization resist composition of the invention comprising the above mentioned alkali-insolubilized resinous ingredient as the component (A) and the acid-generating agent as the component (B) is pattern-wise exposed to actinic rays, an acid is released from the acid-generating agent in the exposed areas so that the resinous ingredient in the exposed areas is rendered alkali-soluble as a consequence of dissociation of the acid-dissociable protective groups to regenerate the hydroxyl groups and selectively dissolved away in the development treatment with an aqueous alkaline developer solution to give a positively patterned resist layer. In the negative-working resist composition of the invention in which the resinous ingredient contains an acid-crosslinkable compound, the resist layer is insolubilized in the pattern-wise exposed areas due to the crosslinking reaction of the acid-crosslinkable compound by the interaction with the acid released from the acid-generating agent as the component (B) so that the resist layer in the unexposed areas is selectively dissolved away in the development treatment to give a negatively patterned resist layer.

The above mentioned hydroxyl group-containing alkali-soluble resin is exemplified by novolak resins prepared by a condensation reaction of a phenolic compound such as phenol, m- and p-cresols, xylenols, trimethyl phenols and the like with an aldehyde compound such as formaldehyde and the like in the presence of an acid catalyst, hydroxystyrene-based polymers including homopolymers of a hydroxystyrene, copolymers of hydroxystyrene and other styrene monomers, copolymers of hydroxystyrene and an acrylic monomer such as (meth)acrylic acid and derivatives thereof, (meth)acrylic acid-based polymers including copolymers of (meth)acrylic acid and other comonomers copolymerizable therewith, and so on.

The hydroxyl group-containing resin rendered alkali-insoluble by the substitution of acid-dissociable protective groups for the hydroxyl groups is exemplified by the hydroxystyrene-based polymers including homopolymers of a hydroxystyrene, copolymers of a hydroxystyrene and other styrene monomers, copolymers of a hydroxystyrene and an acrylic monomer such as (meth)acrylic acid and derivatives thereof and (meth)acrylic acid-based polymers including copolymers of (meth)acrylic acid and other comonomers copolymerizable therewith substituted by acid-dissociable protective groups for a part of the phenolic or carboxylic hydroxyl groups.

The above mentioned styrene monomers copolymerizable with hydroxystyrene include styrene, α-methylstyrene, p- and o-methylstyrenes, p-methoxystyrene, p-chlorostyrene and the like. The derivatives of (meth)acrylic acid mentioned above include methyl (meth)acrylate, ethyl (meth)acrylate, 2-hydroxyethyl (meth)acrylate, 2-hydroxypropyl (meth)acrylate, (meth)acrylamide, (meth)acrylonitrile and the like.

The acid-dissociable protective group mentioned above is exemplified by tert-alkoxycarbonyl groups such as tert-butoxycarbonyl group, tert-amyloxycarbonyl group, tert-alkyl groups such as tert-butyl group and the like, alkoxyalkyl groups such as ethoxyethyl group, methoxypropyl group and the like, acetal groups such as tetrahydropyranyl group, tetrahydrofuranyl group and the like, benzyl group, trimethylsilyl group and so on.

It is preferable that from 1 to 60% or, more preferably, from 10 to 50% of the hydroxyl groups in the hydroxyl group-containing resin are protected by substitution of the above mentioned acid-dissociable groups.

The positive-working chemical-sensitization resist composition as a class of the inventive compositions contains, preferably, as the component (A), a hydroxyl group-containing resin alkali-insolubilized by substitution of the acid-dissociable groups for the hydroxyl groups or, in particular, a polyhydroxystyrene resin substituted by tert-butoxycarbonyl groups or alkoxyalkyl groups, e.g., ethoxyethyl and methoxypropyl groups, for a part of the hydroxyl groups. In particular, the component (A) is a combination of a first polyhydroxystyrene resin substituted by tert-butoxycarbonyl groups for 10 to 50% or, preferably, 15 to 40% of the hydroxyl groups and a second polyhydroxystyrene resin substituted by alkoxyalkyl groups, e.g., ethoxyethyl or methoxypropyl groups, for 10 to 50% or, preferably, 15 to 40% of the hydroxyl groups in a weight proportion of the first resin to the second resin in the range from 5:95 to 50:50 or, preferably, from 10:90 to 30:70.

The negative-working chemical sensitization resist compositions as the other class of the inventive compositions, on the other hand, contain, as the component (A), an alkali-soluble resin, e.g., novolak resins, hydroxystyrene-based polymers, (meth)acrylic acid-based polymers and the like, optionally, substituted by the acid-dissociable groups for a part of the hydroxyl groups, and an acid-crosslinkable compound in combination. In particular, the alkali-soluble resin is preferably a cresol novolak resin, polyhydroxystyrene resin or copolymer of hydroxystyrene and styrene, optionally, substituted by tert-butoxycarbonyl groups for a part of the hydroxyl groups.

The acid-crosslinkable compound formulated in the negative-working chemical-sensitization resist composition of the invention can be selected without particular limitations from those conventionally used in the photoresist compositions of the same type in the prior art. Examples of suitable acid-crosslinkable compounds include amino resins having hydroxyl groups or alkoxy groups such as melamine resins, urea resins, guanamine resins, acetoguanamine resins, benzoguanamine resins, glycoluryl-formaldehyde resins, succinylamide-formaldehyde resins, ethyleneurea-formaldehyde resins and the like. These amino resins can be readily prepared by the methylolation reaction of melamine, urea, guanamine, acetoguanamine, benzoguanamine, glycoluryl, succinylamide, ethyleneurea and the like with formaldehyde in boiling water, optionally, followed by the alkoxylation reaction of the methylol groups with a lower alcohol. Various commercial resinous products of these types are available and can be used as such as the acid-crosslinkable compound in the present invention. Examples of such commercial products include Nikalacs Mx-750, Mw-30 and Mw-100LM as melamine resins and Nikalac Mx-290 as a urea resin (each a product by Sanwa Chemical Co.). Commercial products of benzoguanamine resins are also available with tradenames of Cymels 1123 and 1128 (each a product by Mitsui Cyanamide Co.).

Besides the above mentioned amino resins, benzene compounds having alkoxy groups such as 1,3,5-tris(methoxymethoxy) benzene, 1,2,4-tris(isopropoxymethoxy) benzene and 1,4-bis(sec-butoxymethoxy) benzene and phenol compounds having hydroxyl or alkoxy groups such as 2,6-dihydroxymethyl p-cresol and 2,6-dihydroxymethyl-p-tert-butyl phenol can also be used as the acid-crosslinkable compound in the inventive negative-working resist composition.

The above described various acid-crosslinkable compounds can be used either singly or as a combination of two kinds or more according to need.

The negative-working chemical-sensitization resist composition of the invention contains the above described alkali-soluble resin and acid-crosslinkable compound in combination in a weight proportion in the range from 100:3 to 100:70 or, preferably, from 100:5 to 100:50. When the amount of the acid-crosslinkable compound is too small, the resist composition is not imparted with sufficiently high sensitivity while, when the amount thereof is too large, a uniform resist layer can hardly be formed from the resist composition along with a decrease in the developability not to give a patterned resist layer of high quality.

The alkali-soluble resin used as the component (A) in the inventive resist composition preferably has a weight-average molecular weight in the range from 2000 to 20000. The molecular weight distribution should preferably be as narrow as possible and the ratio of the weight-average molecular weight to number-average molecular weight $M_w:M_n$ as a measure of the molecular weight distribution should not exceed 5.0 or, preferably, 3.0 for novolak resins and should not exceed 5.0 or, preferably, 2.5 or, more preferably, 1.5 for hydroxystyrene-based resins.

The chemical-sensitization resist composition of the invention is essentially contains, as the radiation-sensitive acid-generating agent, an oximesulfonate compound represented by the general formula

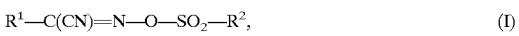

$$R^1\text{—}C(CN)\text{=}N\text{—}O\text{—}SO_2\text{—}R^2, \qquad (I)$$

in which $R^1$ is a monovalent inert organic group and $R^2$ is an unsubstituted or substituted monovalent hydrocarbon group selected from the group consisting of aromatic polycyclic hydrocarbon groups and unsaturated or saturated non-aromatic polycyclic hydrocarbon groups.

The above mentioned inert organic group denoted by $R^1$ in the general formula (I) is a group having no reactivity with the various ingredients contained in the inventive resist composition. Though not particularly limitative, the group $R^1$ is preferably an aromatic cyclic group in respect of the sensitivity to deep ultraviolet light, electron beams and X-rays. The aromatic cyclic group here implied is a group having physical and chemical properties inherent in aromatic compounds including, for example, phenyl, naphthyl, furyl and thienyl groups, optionally, substituted by inert substituent groups such as halogen atoms, e.g., atoms of chlorine, bromine and iodine, alkyl groups, alkoxy groups and nitro groups.

The aromatic polycyclic hydrocarbon group as a class of the group denoted by $R^2$ in the general formula (I) is exemplified by aromatic condensed polycyclic hydrocarbon groups such as 2-indenyl, 1-naphthyl, 2-naphthyl and 2-anthryl groups and aromatic non-condensed polycyclic hydrocarbon groups such as biphenyl and terphenyl groups. These hydrocarbon groups can be substituted by a substituent such as an atom of halogen, e.g., chlorine, bromine and iodine, nitro group, amino group, hydroxyl group, alkyl group and alkoxy group as in 5-hydroxy-1-naphthyl group and 4-amino-1-naphthyl group.

The unsaturated or saturated non-aromatic polycyclic hydrocarbon group as the other class of the groups denoted by $R^2$ in the general formula (I) is preferably a polycyclic hydrocarbon group such as a polycyclic terpene residue and adamantyl group which can be substituted on the ring by an atom of halogen, e.g., chlorine, bromine and iodine, nitro group, amino group, hydroxyl group, oxo group, alkyl group or alkoxy group. Examples of the groups suitable as $R^2$ include camphor-3-yl, camphor-8-yl, camphor-10-yl and 3-bromocamphor-10-yl groups. The group $R^2$ is preferably a naphthyl group or camphor-10-yl group or, more preferably, 1-naphthyl group in respect of the good pattern resolution.

The most characteristic feature of the present invention consists in the use-of the above described very specific oximesulfonate compound as the acid-generating agent which imparts the chemical-sensitization resist composition with high sensitivity and high pattern resolution as well as excellent orthogonality of the cross sectional profile of the patterned resist layer. This feature is in great contrast with chemical-sensitization resist compositions formulated with a conventional oximesulfonate compound from which an acid such as p-toluenesulfonic acid or benzenesulfonic acid is generated. These sulfonic acids have a problem that the diffusion thereof in the post-exposure baking treatment of the resist layer is so large, in a positive-working resist layer, that the patterned hole in hole patterning has a larger diameter than the diameter in the mask pattern not to give desired pattern resolution. The advantage in the inventive resist composition in this regard is presumably due to the fact that the molecule of the acid released from the group $R^2$ by exposure to deep ultraviolet light, electron beams, X-rays and the like is too bulky to cause rapid diffusion of the acid molecules in the post-exposure baking treatment consequently with an improvement in the pattern resolution.

A problem in the prior art in this regard is that, when patterning is performed with ultraviolet light or deep ultraviolet light such as the i-line light of 365 nm wave-length and excimer laser beams, too large bulkiness of the acid molecules generated from the acid-generating agent results in insufficient diffusion of the acid molecules through the resist layer so that the adverse influence of the standing waves of the exposure light is increased so much and the patterned resist layer may have a wavy cross sectional profile. This is the reason for the attempts to use an acid-generating agent from which an acid having relatively small bulkiness of the molecule. In the present invention, in contrast thereto, high pattern resolution can be obtained in the pattern-wise exposure to electron beams and X-rays notwithstanding the bulkiness of the acid molecules generated from the oximesulfonate compound of the general formula (I). Furthermore, a patterned resist layer having excellent cross sectional profile can be obtained even by the exposure to deep ultraviolet light such as excimer laser beams from the resist composition of the invention containing the oximesulfonate compound of the general formula (I) in combination with the oximesulfonate compound of the general formula (II) or (III). This advantage is particularly remarkable when the inventive resist composition is negative-working.

The oximesulfonate compound of the above given general formula (I) can be prepared by a known method. For example, a compound having an oxime group in the molecule and a compound having a sulfonyl chloride group in the molecule are subjected to an esterification reaction in an organic solvent such as tetrahydrofuran, N,N-dimethylformamide, N,N-dimethylacetamide and N-methyl pyrrolidone in the presence of a basic catalyst such as pyridine, triethylamine and the like. The above mentioned oxime group-containing compound can be prepared by the methods described in literatures including: The Systematic Identification of Organic Compounds, page 181 (John Wiley & Sons, 1980); Die Makromoleculare Chemie, volume 108, page 170 (1967); Organic Syntheses, volume 59, page 95 (1979); and elsewhere.

Examples of the oximesulfonate compounds represented by the general formula (I) and suitable as the component (B) in the inventive chemical-sensitization resist composition include:

α-(1-naphthylsulfonyloxyimino)-4-methoxybenzyl cyanide of the formula

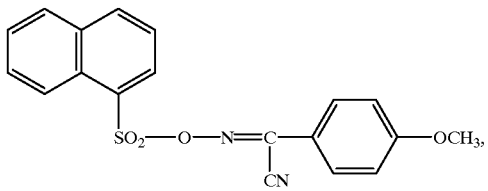

α-(2-naphthylsulfonyloxyimino)-4-methoxybenzyl cyanide of the formula

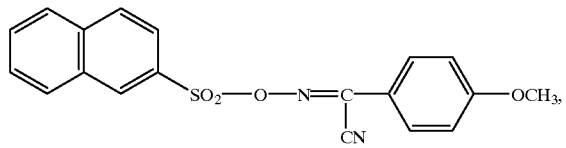

α-(10-camphorsulfonyloxyimino)-4-methoxybenzyl cyanide of the formula

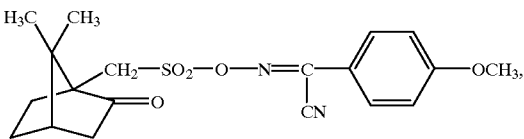

α-(1-naphthylsulfonyloxyimino)benzyl cyanide of the formula

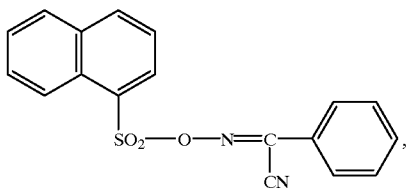

α-(2-naphthylsulfonyloxyimino)benzyl cyanide of the formula

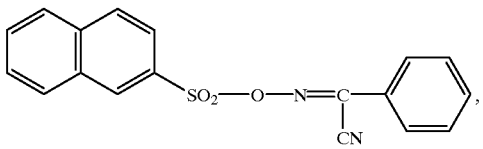

α-(10-camphorsulfonyloxyimino)benzyl cyanide of the formula

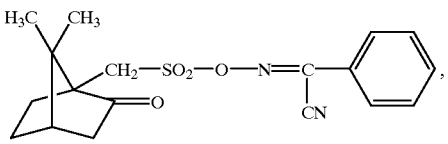

and

α-(3-camphorsulfonyloxyimino)-4-methoxybenzyl cyanide of the formula

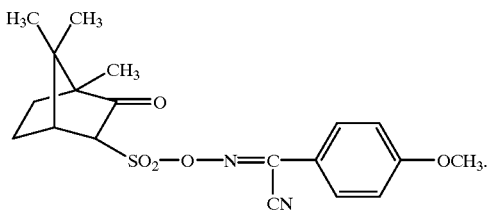

The above described various oximesulfonate compounds represented by the general formula (I) can be used either singly or as a combination of two kinds or more according to need as the component (B) to serve as an acid-generating agent in the inventive resist composition. It is preferable that, when further improvement is desired in the sensitivity and pattern resolution of the inventive resist composition or, in particular, the positive-working resist composition of the invention, the acid-generating agent is a combination of the oximesulfonate compound of the general formula (I) and an onium salt compound.

Examples of suitable onium salt compounds include:
diphenyliodonium tetrafluoroborate;
diphenyliodonium trifluoromethanesulfonate;
diphenyliodonium hexafluoroantimonate;
(4-methoxyphenyl)phenyliodonium hexafluoroantimonate;
(4-methoxyphenyl)phenyliodonium trifluoromethanesulfonate;
bis(p-tert-butylphenyl)iodonium trifluoromethanesulfonate;
triphenylsulfonium trifluoromethanesulfonate;
(4-methoxyphenyl)diphenylsulfonium hexafluoroantimonate;
(4-methoxyphenyl)diphenylsulfonium trifluoromethanesulfonate;
(4-methylphenyl)diphenylsulfonium trifluoromethanesulfonate; and
(4-tert-butylphenyl)diphenylsulfonium trifluoromethanesulfonate.

When the acid-generating agent is a combination of the oxime-sulfonate compound of the general formula (I) and an onium salt compound, the weight proportion of the onium salt compound preferably does not exceed 80% of the total amount of both.

When the chemical-sensitization resist composition is intended for use as a positive-working resist composition to be pattern-wise exposed to deep ultraviolet light such as excimer laser beams, it is optional that the acid-generating agent further comprises a diazomethane compound which is exemplified by bissulfonyl diazomethane compounds such as bis(p-toluenesulfonyl) diazomethane, bis(1,1-dimethylethylsulfonyl) diazomethane, bis(cyclohexylsulfonyl) diazomethane, bis(2,4-dimethylphenylsulfonyl) diazomethane and the like.

Further, the acid-generating agent in the inventive chemical-sensitization resist composition can be a combination of the oximesulfonate compound represented by the general formula (I) with a second oximesulfonate compound represented by the general formula $$R^3\text{—C(CN)=N—O—SO}_2\text{—R}^4, \quad (II)$$

in which $R^3$ is an unsubstituted or substituted, unsaturated or saturated non-aromatic monovalent hydrocarbon group or aromatic monovalent cyclic group and $R^4$ is an unsubstituted or substituted, unsaturated or saturated non-aromatic monovalent hydrocarbon group, and/or a third oximesulfonate compound represented by the general formula $$A\text{—[C(CN)=N—O—SO}_2\text{—R}^5]_n, \quad (III)$$

in which the subscript n is 2 or 3, each $R^5$ is an unsubstituted or substituted monovalent hydrocarbon group and A is a divalent organic group, when the subscript n is 2, or a tervalent organic group, when the subscript n is 3. The inventive chemical-sensitization resist composition can be a negative-working resist composition suitable for patternwise exposure to deep ultraviolet light such as excimer laser beams when the acid-generating agent is a combination of the above mentioned two or three different oximesulfonate compounds. The divalent or tervalent organic group mentioned above is a residue of an organic compound from which two or three hydrogen atoms are removed to leave 2 or 3 free bonds available for the formation of chemical bonds.

The above mentioned second oximesulfonate compound represented by the general formula (II) is selected preferably from those expressed by the general formula $$R^8\text{—C(CN)=N—O—SO}_2\text{—R}^9, \quad (V)$$

in which each of $R^8$ and $R^9$ is a non-aromatic monovalent hydrocarbon group and those expressed by the general formula $$R^{10}\text{—C(CN)=N—O—SO}_2\text{—R}^{11}, \quad (VI)$$

in which $R^{10}$ is an aromatic monovalent cyclic group and $R^{11}$ is an unsubstituted or halogen-substituted lower alkyl group.

The above mentioned non-aromatic monovalent hydrocarbon group is exemplified by alkyl groups, halogenoalkyl groups, alkenyl groups, cycloalkyl groups, cycloalkenyl groups, alkoxy groups, cycloalkoxy groups and adamantyl group. The alkyl group is preferably a straightly linear or branched alkyl group having 1 to 12 carbon atoms such as methyl, ethyl, n-propyl, isopropyl, n-butyl, isobutyl, sec-butyl, tert-butyl, n-pentyl, n-octyl and n-dodecyl groups. The halogenoalkyl group includes monohalogenoalkyl groups and polyhalogenoalkyl groups without particular limitations. The halogen of the halogenoalkyl groups can be fluorine, chlorine, bromine or iodine. The halogenoalkyl group preferably has 1 to 4 carbon atoms as exemplified by chloromethyl, trichloromethyl, trifluoromethyl and 2-bromopropyl groups.

The alkenyl group mentioned above is preferably a straightly linear or branched alkenyl group having 2 to 6 carbon atoms exemplified by vinyl, 1-propenyl, isopropenyl and 2-butenyl groups. The cycloalkyl group preferably has 5 to 12 carbon atoms as exemplified by cyclopentyl, cyclohexyl, cyclooctyl and cyclododecyl groups. The cycloalkenyl group preferably has 4 to 8 carbon atoms as exemplified by 1-cyclobutenyl, 1-cyclopentenyl, 1-cyclohexenyl, 1-cycloheptenyl and 1-cyclooctenyl groups. The alkoxy group preferably has 1 to 8 carbon atoms as exemplified by methoxy, ethoxy, propoxy, butoxy and pentoxy groups. The cycloalkoxy group preferably has 5 to 8 carbon atoms as exemplified by cyclopentyloxy and cyclohexyloxy-groups.

The group denoted by $R^8$ in the general formula (V) is preferably selected from the group consisting of alkyl groups, cycloalkyl groups and cycloalkenyl groups or, more preferably, from cycloalkenyl groups. The group denoted by $R^9$ in the general formula (V) is preferably selected from the group consisting of straightly linear or branched alkyl groups having 1 to 4 carbon atoms, halogenoalkyl groups having 1 to 4 carbon atoms, alkoxy groups having 1 to 4 carbon atoms and alkenyl groups having 2 to 4 carbon atoms. The number of the halogen atoms in the halogenoalkyl group is not particularly limitative and can be 1 or larger than 1. The halogen element of the halogenoalkyl group can be any of fluorine, chlorine, bromine and iodine. The group denoted by $R^9$ is an alkyl group or halogenoalkyl group having 1 to 4 carbon atoms or, preferably, an alkyl group having 1 to 4 carbon atoms. More preferable is a compound of the general formula (V) in which $R^8$ is a cycloalkenyl group and $R^9$ is an alkyl group having 1 to 4 carbon atoms.

Examples of the oximesulfonate compound expressed by the general formula (V) include:

α-(methyl sulfonyloxyimino)-1-cyclopentenyl acetonitrile,

α-(methyl sulfonyloxyimino)-1-cyclohexenyl acetonitrile,

α-(methyl sulfonyloxyimino)-1-cycloheptenyl acetonitrile,

α-(methyl sulfonyloxyimino)-1-cyclooctenyl acetonitrile,

α-(trifluoromethyl sulfonyloxyimino)-1-cyclopentenyl acetonitrile,

α-(trifluoromethyl sulfonyloxyimino)cyclohexyl acetonitrile,

α-(ethyl sulfonyloxyimino)ethyl acetonitrile,

α-(propyl sulfonyloxyimino)propyl acetonitrile,

α-(ethyl sulfonyloxyimino)-1-cyclopentenyl acetonitrile,

α-(isopropyl sulfonyloxyimino)-1-cyclopentenyl acetonitrile,

α-(n-butyl sulfonyloxyimino)-1-cyclopentenyl acetonitrile,

α-(ethyl sulfonyloxyimino)-1-cyclohexenyl acetonitrile,

α-(isopropyl sulfonyloxyimino)-1-cyclohexenyl acetonitrile,

α-(n-butyl sulfonyloxyimino)-1-cyclohexenyl acetonitrile and the like.

In the above given general formula (VI), the aromatic cyclic group denoted by $R^{10}$ includes phenyl, naphthyl, furyl and thienyl groups, which can be substituted by one or more of certain substituents such as halogen atoms, alkyl groups, alkoxy groups, nitro groups and the like. The alkyl group denoted by $R^{11}$ is a straightly linear or branched alkyl group having 1 to 4 carbon atoms such as methyl, ethyl, n-propyl, isopropyl, n-butyl, isobutyl, sec-butyl and tert-butyl groups. The halogenated lower alkyl group as a class of the groups denoted by $R^{11}$ is a halogenated lower alkyl group having 1 to 4 carbon atoms such as chloromethyl, trichloromethyl, trifluoromethyl and 2-bromopropyl groups.

Examples of the oximesulfonate compounds expressed by the above given general formula (VI) include:

α-(methylsulfonyloxyimino)phenyl acetonitrile;

α-(methylsulfonyloxyimino)-4-methoxyphenyl acetonitrile;

α-(methylsulfonyloxyimino)-4-methylphenyl acetonitrile;

α-(trifluoromethylsulfonyloxyimino)phenyl acetonitrile;

α-(trifluoromethylsulfonyloxyimino)-4-methoxyphenyl acetonitrile;

α-(ethylsulfonyloxyimino)-4-methoxyphenyl acetonitrile;

α-(propylsulfonyloxyimino)-4-methylphenyl acetonitrile;

α-(methylsulfonyloxyimino)-4-bromophenyl acetonitrile; and the like.

The hydrocarbon group as a class of the groups denoted by $R^5$ in the above given general formula (III) is exemplified preferably by straightly linear or branched alkyl groups having 1 to 4 carbon atoms and straightly linear or branched alkenyl groups having 2 to 4 carbon atoms. Examples of the alkyl groups include methyl, ethyl, propyl, isopropyl, n-butyl, sec-butyl and tert-butyl groups and examples of the alkenyl groups include ethenyl, propenyl, butenyl and butadienyl groups.

The hydrocarbon groups having a substituent group as a class of the groups denoted by $R^5$ is exemplified by the alkyl and alkenyl groups named above substituted by substituents, such as atoms of halogen, e.g., chlorine, bromine and fluorine, hydroxyl groups, alkoxy groups and acyl groups, for at least one of the hydrogen atoms. The substituted hydrocarbon group denoted by $R^5$ is preferably a halogenoalkyl group such as chloromethyl, trichloromethyl, trifluoromethyl and 2-bromopropyl groups.

The divalent or tervalent organic group denoted by A in the general formula (III) is exemplified by divalent or tervalent aliphatic and aromatic hydrocarbon groups.

Examples of the oximesulfonate compounds expressed by the above given general formula (III) include those compounds expressed by the following formulas, in which pPn is a 1,4-phenylene group, mPn is a 1,3-phenylene group, Me is a methyl group, Et is an ethyl group, Bu is a butyl group and FMe is a trifluoromethyl group:

Me—$SO_2$—O—N=C(CN)—pPn—C(CN)=N—O—$SO_2$—Me;

Me—$SO_2$—O—N=C(CN)—mPn—C(CN)=N—O—$SO_2$—Me;

Et—$SO_2$—O—N=C(CN)—pPn—C(CN)=N—O—$SO_2$—Et;

Bu—$SO_2$—O—N=C(CN)—mPn—C(CN)=N—O—$SO_2$—Bu;

Bu—$SO_2$—O—N=C(CN)—pPn—C(CN)=N—O—$SO_2$—Bu;

FMe—$SO_2$—O—N=C(CN)—pPn—C(CN)=N—O—$SO_2$—FMe; and

FMe—$SO_2$—O—N=C(CN)—mPn—C(CN)=N—O—$SO_2$—FMe.

The oximesulfonate compounds represented by the general formulas (II) and (III) can be used either singly or as a combination of two kinds or more according to need.

The oximesulfonate compound represented by the general formula (I), when irradiated by actinic rays, releases an acid of high bulkiness of molecules so that, when such an oximesulfonate compound is used singly as the acid-generating agent in a negative-working resist composition for deep ultraviolet light, diffusion of the acid molecules released therefrom through the resist layer is not rapid enough during the post-exposure baking treatment so that the cross sectional profile of the patterned resist layer has a wavy sideline and is trapezoidal narrowing upwardly. When the oximesulfonate compound as the acid generating agent is a compound represented by the general formula (II) or (III), on the other hand, the acid released therefrom by the irradiation with actinic rays has less bulkiness of the molecules rapidly diffusing in the post-exposure baking treatment so that the cross sectional profile of the patterned resist layer is inversely trapezoidal broadening upwardly but without waviness on the sidelines. Accordingly, a preferable formulation of the inventive resist composition is to formulate the oximesulfonate compound of the general formula (I) and the oximesulfonate compound of the general formula (II) or (III) in combination in an appropriate proportion so that a patterned resist layer having an excellent cross sectional profile can be obtained.

Though not particularly limitative, the weight proportion of the above mentioned two classes of the oximesulfonate compounds formulated in combination is in the range from 2:8 to 8:2 or, preferably, from 4:6 to 6:4 in order that the characteristic features of the two classes of the compounds can be exhibited respectively. It is preferable in order to facilitate adequate setting of the sensitivity of the resist composition formulated with the two classes of the oximesulfonate compounds in combination that the two oximesulfonate compounds have light absorption characteristics, e.g., wavelength range of the ultraviolet absorption band and light absorption coefficient, close each to the other. Examples of preferable combinations of the two classes of the oximesulfonate compounds include a combination of α-(1-naphthylsulfonyloxyimino)-4-methoxybenzyl cyanide as the compound of the general formula (I) and α-(methylsulfonyloxyimino)-1-benzyl cyanide as the compound of the general formula (II) or (III) and a combination of α-(10-camphorsulfonyloxyimino)-4-methoxybenzyl cyanide as the compound of the general formula (I) and α-(methylsulfonyloxyimino)-4-methylbenzyl cyanide as the compound of the general formula (II) or (III).

It is optional in the formulation of the inventive resist composition that the oximesulfonate compound of the general formula (I) and/or the oximesulfonate compound of the general formula (II) or (III) are combined with one or more of other oximesulfonate compounds according to need. Such an optional oximesulfonate compound is exemplified by those represented by the above given general formula (V) in which the non-aromatic hydrocarbon group denoted by $R^9$ is an alkyl group, halogenoalkyl group, alkenyl group, cycloalkyl group, cycloalkenyl group, alkoxy group or cycloalkoxy group having 5 to 12 carbon atoms. Particular examples of such groups include n-pentyl, n-octyl, n-dodecyl, hexenyl, cyclopentyl, cyclohexyl, cyclooctyl, cyclododecyl, 1-cyclopentenyl, 1-cyclohexenyl, 1-cycloheptenyl, 1-cyclooctenyl, pentoxy, cyclopentyloxy and cyclohexyloxy groups.

Particular examples of such oximesulfonate compounds include α-(cyclohexylsulfonyloxyimino) cyclopentyl acetonitrile, α-(cyclohexylsulfonyloxyimino) cyclohexyl acetonitrile and α-(cyclohexylsulfonyloxyimino) 1-cyclopentenyl acetonitrile.

It is further optional to use an oximesulfonate compound represented by the above given general formula (III) in which the unsubstituted or substituted hydrocarbon group denoted by $R^5$ is selected from aromatic cyclic groups and alkyl, alkenyl, cycloalkyl and cycloalkenyl groups having 5 to 12 carbon atoms as well as those substituted groups obtained by replacing one or more of the hydrogen atoms in the above named hydrocarbon groups with halogen atoms, hydroxyl groups, alkoxy groups or acyl groups. The above mentioned aromatic cyclic group preferably has 6 to 14 carbon atoms including aromatic hydrocarbon groups such as phenyl, tolyl, methoxyphenyl, xylyl, biphenyl, naphthyl and anthryl groups and heterocyclic groups such as furanyl, pyridyl and quinolyl groups. Examples of the alkyl, alkenyl, cycloalkyl and cycloalkenyl groups having 5 to 12 carbon atoms include n-pentyl, n-octyl, n-dodecyl, hexenyl, octadienyl, cyclopentyl, cyclohexyl, cyclooctyl, cyclododecyl, 1-cyclopentenyl, 1-cyclohexenyl, 1-cycloheptenyl and 1-cyclooctenyl groups.

Particular examples of such oximesulfonate compounds include those expressed by the following formulas, in which pPn is a 1,4-phenylene group, mPn is a 1,3-phenylene group, Me is a methyl group, Ch is a cyclohexyl group and Ph is a phenyl group:

Ch—SO$_2$—O—N═C(CN)—pPn—C(CN)═N—O—SO$_2$—Ch;

Ph—SO$_2$—O—N═C(CN)—pPn—C(CN)═N—O—SO$_2$—Ph;

Me—pPn—SO$_2$—O—N═C(CN)—pPn—C(CN)═N—O—SO$_2$—pPn—Me;

Me—pPn—SO$_2$—O—N═C(CN)—mPn—C(CN)═N—O—SO$_2$—pPn—Me; and

MeO—pPn—SO$_2$—O—N═C(CN)—mPn—C(CN)═N—O—SO$_2$—pPn—OMe.

As to the proportion of compounding of the respective components in the inventive resist composition, it is advantageous that the acid-generating agent is used in an amount in the range from 0.5 to 20 parts by weight or, preferably, from 1.0 to 10.0 parts by weight as the oximesulfonate compound per 100 parts by weight of the film-forming constituent as the component (A) in consideration of the balance of the properties such as image formation, formation of a resist film and developability. When the amount of the acid-generating agent is too small, full image formation cannot be accomplished while, when the amount thereof is too large, a good resist film can hardly be formed from the composition along with a decrease in the developability not to give an excellently patterned resist layer.

It is optional that the resist composition of the invention is admixed, in order to improve the stability of the latent image formed in the resist layer after pattern-wise exposure to actinic rays before a post-exposure baking treatment, with an amine compound including aliphatic amines such as trimethylamine, ethylamine, diethylamine, triethylamine, n-propylamine, di-n-propylamine and tri-n-propylamine, aromatic amines such as benzylamine, aniline, N-methylaniline and N,N-dimethylaniline and heterocyclic amines such as pyridine, 2-methylpyridine, 2-ethylpyridine and 2,3-dimethylpyridine, of which triethylamine is particularly preferable because this amine compound gives a resist composition of which the cross sectional profile of the patterned resist layer is excellently orthogonal along with good stability of the latent images formed in the resist layer by pattern-wise exposure to actinic rays.

Further, it is optional according to need that the inventive resist composition is admixed with a carboxylic acid including saturated or unsaturated aliphatic carboxylic acids such as butyric acid, isobutyric acid, oxalic acid, malonic acid, succinic acid, acrylic acid, crotonic acid, isocrotonic acid, 3-butenoic acid, methacrylic acid and 4-pentenoic acid, alicyclic carboxylic acid such as 1,1-cyclohexane dicarboxylic acid, 1,2-cyclohexane dicarboxylic acid, 1,3-cyclohexane dicarboxylic acid, 1,4-cyclohexane dicarboxylic acid and 1,1-cyclohexyl diacetic acid and aromatic carboxylic acids having a hydroxyl, nitro, carboxyl or vinyl groups as the substituent such as p-hydroxybenzoic acid, o-hydroxybenzoic acid, 2-hydroxy-3-nitrobenzoic acid, 3,5-dinitrobenzoic acid, 2-nitrobenzoic acid, 2,4-dihydroxybenzoic acid, 2,5-dihydroxybenzoic acid, 2,6-dihydroxybenzoic acid, 3,4-dihydroxybenzoic acid, 3,5-dihydroxybenzoic acid, 2-vinylbenzoic acid, 4-vinylbenzoic acid, phthalic acid, terephthalic acid and isophthalic acid.

Among the above named carboxylic acids, aromatic carboxylic acids are preferred in respect of the adequate strength of the acid. In particular, salicylic acid is more preferable because this acid has good solubility in the solvents used in resist compositions along with excellent patterning behavior of the resist composition formulated therewith.

As to the amounts of addition of these amine compounds and carboxylic acid compounds, the amount of the amine compound is in the range from 0.01 to 1% by weight or, preferably, from 0.05 to 0.5% by weight and the amount of the carboxylic acid compound is in the range from 0.01 to 10% y weight or, preferably, from 0.05 to 2.0% by weight each based on the amount of the component (A).

It is usually preferable that the resist composition of the invention is in the form of a solution prepared by dissolving the above described ingredients in a suitable organic solvent. Examples of suitable organic solvents include ketone solvents such as acetone, methyl ethyl ketone, cyclohexanone, methyl isoamyl ketone and 2-heptanone, polyhydric alcohols and derivatives thereof such as ethyleneglycol, ethyleneglycol monoacetate, diethyleneglycol, diethyleneglycol monoacetate, propyleneglycol, propyleneglycol monoacetate, dipropyleneglycol and dipropyleneglycol monoacetate as well as monomethyl, monoethyl, monopropyl, monobutyl and monophenyl ethers thereof, cyclic ether solvents such as dioxane, ester solvents such as methyl lactate, ethyl lactate, methyl acetate, ethyl acetate, butyl acetate, methyl pyruvate, ethyl pyruvate, methyl methoxypropionate and ethyl ethoxypropionate, and amide solvents such as N,N-dimethylformamide, N,N-dimethylacetamide and N-methyl-2-pyrrolidone. These organic solvents can be used either singly or as a mixture of two kinds or more according to need.

It is of course optional according to need that the resist composition of the present invention is admixed with various kinds of known additives conventionally used in resist compositions such as auxiliary resins to modify the film properties, plasticizers, stabilizers, coloring agents, surface active agents and the like each in a limited amount.

The procedure for photolithographic patterning by using the inventive resist composition can be conventional as in the use of prior art resist compositions. Namely, a substrate such as a semiconductor silicon wafer is coated uniformly with the resist composition by using a suitable coating machine such as spinners followed by drying to form a dried resist layer which is pattern-wise exposed to actinic rays such as deep ultraviolet light, X-rays, electron beams and the like followed by a post-exposure baking treatment. Thereafter, the resist layer is subjected to a development treatment with an aqueous alkaline developer solution which is typically a 1 to 10% by weight aqueous solution of tetramethylammonium hydroxide so as to dissolve away the resist layer pattern-wise. The thus obtained patterned resist layer is excellent in pattern resolution and has an orthogonal cross sectional profile.

The present invention also provides a class of novel radiation-sensitive acid-generating compounds useful as an ingredient in a chemical-sensitization resist composition. The novel compound is an oximesulfonate compounds represented by the general formula

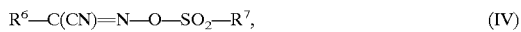

in which $R^6$ is an aromatic cyclic group and $R^7$ is a naphthyl group or a camphor residue. The aromatic cyclic group denoted by $R^8$ in the general formula (IV) is exemplified by the same groups given as the examples of the aromatic cyclic group denoted by $R^1$ in the general formula (I).

By virtue of the bulkiness of the acid molecules derived from the group $R^7$ in the oximesulfonate compound of the general formula (IV) and released in the resist layer, i.e. naphthalenesulfonic acid or camphorsulfonic acid, by the exposure of the resist layer to actinic rays, the inventive chemical-sensitization resist composition containing the oximesulfonate compound as an acid generating agent has an advantage of high pattern resolution.

In the following, the chemical-sensitization resist composition of the present invention is illustrated in more detail by way of Examples, which, however, never limit the scope of the invention in any way, as preceded by a description of the synthetic procedure for several oximesulfonate compounds used in the formulation of the resist compositions.

Preparation 1.

α-(1-Naphthylsulfonyloxyimino)-4-methoxybenzyl cyanide expressed by the structural formula

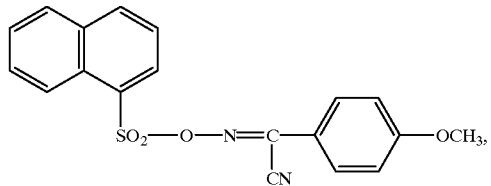

was synthesized in the following manner.

Thus, 51.0 g (0.29 mole) of α-hydroxyimino-4-methoxybenzyl cyanide and 44.0 g (0.43 mole) of triethylamine were dissolved in 400 ml of tetrahydrofuran in a reaction vessel and the solution was chilled to and kept at −5° C. Thereafter, 72.3 g (0.32 mole) of 1-nahthalenesulfonyl chloride were added to the solution dropwise over 2 hours and the reaction mixture was agitated for further 3 hours at −5° C. and then for 2 hours at about 10° C. In the next place, the reaction mixture was freed from tetrahydrofuran by distillation under reduced pressure at 30° C. to give 101.1 g of a solid product, which was purified by repeating recrystallization from acetonitrile to give 74.5 g of a white crystalline product melting at 121° C . Assuming that this product was the desired oximesulfonate compound mentioned above, the yield of the product corresponds to 70% of the theoretical value.

The infrared absorption spectrum of the above obtained product compound had absorption bands with peaks at wave numbers of 711 cm$^{-1}$, 838 cm$^{-1}$, 1186 cm$^{-1}$, 1606 cm$^{-1}$ and 2237 cm$^{-1}$. The proton NMR absorption spectrum ($^1$H—NMR, solvent: acetone-d$_6$) had peaks at δ of 3.80 ppm, 6.91 ppm, 7.54 ppm, 7.60 to 7.87 ppm, 8.05 ppm, 8.37 ppm, 8.50 ppm and 8.72 ppm. Further, the ultraviolet absorption spectrum of the compound in propyleneglycol monomethyl ether as the solvent had absorption bands at $\lambda_{max}$=229 nm with ε=31700 and $\lambda_{max}$=321 nm with ε=15600.

Preparation 2.

α-(2-Naphthylsulfonyloxyimino)-4-methoxybenzyl cyanide expressed by the structural formula

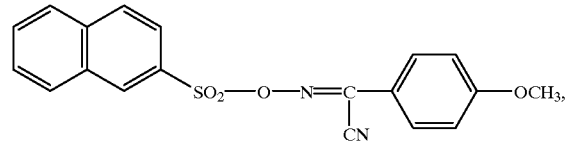

was synthesized in substantially the same manner as in Preparation 1 described above excepting for the replacement of 72.3 g (0.32 mole) of 1-nahthalenesulfonyl chloride with the same amount of 2-nahthalenesulfonyl chloride to give 69.1 g of a white crystalline product melting at 108° C. Assuming that this product was the desired oximesulfonate compound mentioned above, the yield of the product corresponds to 65% of the theoretical value.

The infrared absorption spectrum of the above obtained product compound had absorption bands with peaks at wave numbers of 709 cm$^{-1}$, 860 cm$^{-1}$, 1186 cm$^{-1}$, 1606 cm$^{-1}$ and 2237 cm$^{-1}$. The proton NMR absorption spectrum ($^1$H—NMR, solvent: acetone-d$_6$) had peaks at δ of 3.85 ppm, 6.99 ppm, 7.69 to 8.27 ppm, and 8.80 ppm. Further, the ultraviolet absorption spectrum of the compound in propyleneglycol monomethyl ether as the solvent had absorption bands at $\lambda_{max}$=231 nm with ε=57600 and $\lambda_{max}$=326 nm with ε=14000.

Preparation 3.

α-(10-Camphorsulfonyloxyimino)-4-methoxybenzyl cyanide expressed by the structural formula

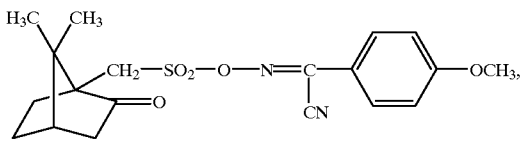

was synthesized in substantially the same manner as in Preparation 1 described above excepting for the replacement of 72.3 g (0.32 mole) of 1-naphthalenesulfonyl chloride with 84.5 g (0.32 mole) of (+)10-camphorsulfonyl chloride to give 58.7 g of a white crystalline product melting at 130° C. Assuming that this product was the desired oximesulfonate compound mentioned above, the yield of the product corresponds to 50.0% of the theoretical value.

The infrared absorption spectrum of the above obtained product compound had absorption bands with peaks at wave numbers of 838 cm$^{-1}$, 1180 cm$^{-1}$, 1265 cm$^{-1}$, 1606 cm$^{-1}$ and 1749 cm$^{-1}$. The proton NMR absorption spectrum ($^1$H-NMR, solvent: acetone-d$_6$) had peaks at δ of 0.90 ppm, 1.15 ppm, 1.40 to 2.60 ppm, 3.90 ppm, 7.00 ppm and 7.85 ppm. Further, the ultraviolet absorption spectrum of the compound in propyleneglycol monomethyl ether as the solvent had absorption bands at $\lambda_{max}$=229 nm with ε=8300 and $\lambda_{max}$=324 nm with ε=13500.

Preparation 4.

α-(3-Bromo-10-camphorsulfonyloxyimino)-4-methoxybenzyl cyanide expressed by the structural formula

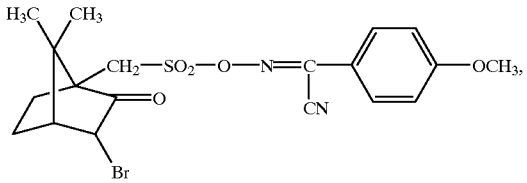

was synthesized in the following manner.

The synthetic procedure was substantially the same as in Preparation 1 excepting for the increase of the amount of α-hydroxyimino-4-methoxybenzyl cyanide from 51.0 g to 63.3 g (0.36 mole) and replacement of 72.3 g (0.32 mole) of 1-naphthalenesulfonyl chloride with 141.5 g (0.43 mole) of 3-bromo-10-camphorsulfonyl chloride to obtain 101.5 g of a white crystalline product melting at 121° C. Assuming that this product is the above mentioned target compound, this yield corresponds to 60.0% of the theoretical value.

The infrared absorption spectrum of the above obtained product compound had absorption bands with peaks at wave numbers of 838 cm$^{-1}$, 1180 cm$^{-1}$, 1265 cm$^{-1}$, 1606 cm$^{-1}$ and 1749 cm$^{-1}$. The proton NMR absorption spectrum ($^1$H-NMR, solvent: acetone-d$_6$) had peaks at δ of 0.90 ppm, 1.15 ppm, 1.40 to 2.60 ppm, 3.90 ppm, 7.00 ppm and 7.85 ppm. Further, the ultraviolet absorption spectrum of the compound in propyleneglycol monomethyl ether as the solvent had absorption bands at $\lambda_{max}$=229 nm with ε=8300 and $\lambda_{max}$=324 nm with ε=13500.

Preparation 5.

α-(3-Bromo-10-camphorsulfonyloxyimino)-4-bromobenzyl cyanide expressed by the structural formula

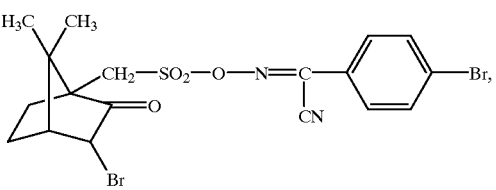

was synthesized in the following manner.

The synthetic procedure was substantially the same as in Preparation 1 excepting for the replacement of α-hydroxyimino-4-methoxybenzyl cyanide with 81.0 g (0.36 mole) of α-hydroxyimino-4-bromobenzyl cyanide and replacement of 72.3 g (0.32 mole) of 1-naphthalenesulfonyl chloride with 141.5 g (0.43 mole) of 3-bromo-10-camphorsulfonyl chloride to obtain 100.8 g of a white crystalline product melting at 115° C. Assuming that this product is the above mentioned target compound, this yield corresponds to 54.0% of the theoretical value.

The infrared absorption spectrum of the above obtained product compound had absorption bands with peaks at wave numbers of 838 cm$^{-1}$, 1180 cm$^{-1}$, 1265 cm$^{-1}$, 1606 cm$^{-1}$ and 1749 cm$^{-1}$. The proton NMR absorption spectrum ($^1$H-NMR, solvent: acetone-d$_6$) had peaks at δ of 0.90 ppm, 1.15 ppm, 1.40 to 2.60 ppm, 7.80 ppm and 7.88 ppm. Further, the ultraviolet absorption spectrum of the compound in propyleneglycol monomethyl ether as the solvent had absorption bands at $\lambda_{max}$=226 nm with ε=3000 and $\lambda_{max}$=292 nm with ε=11000.

EXAMPLE 1

A chemical-sensitization positive-working resist composition was prepared by dissolving, in 400 parts by weight of propyleneglycol monomethyl ether acetate, 25 parts by weight of a first polyhydroxystyrene resin having a weight-average molecular weight of 12000 with a molecular weight distribution $M_w$:$M_n$ of 4.6, which was substituted by tert-butyloxycarbonyl groups for 39% of the hydroxyl groups, 75 parts by weight of a second polyhydroxystyrene resin having a weight-average molecular weight of 12000 with a molecular weight distribution $M_w$:$M_n$ of 4.6, which was substituted by ethoxyethyl groups for 39% of the hydroxyl groups, 3 parts by weight of the oximesulfonate compound prepared in Preparation 1 described above, i.e. α-(1-naphthylsulfonyloxyimino)-4-methoxybenzyl cyanide, as the acid-generating agent, 0.06 part by weight of triethylamine and 0.06 part by weight of salicylic acid followed by filtration of the solution through a membrane filter of 0.2 μm pore diameter.

A semiconductor silicon wafer was coated on a spinner with the thus prepared positive-working resist solution followed by drying on a hot plate at 100° C. for 90 seconds to give a dried resist layer having a thickness of 1.5 μm. This resist layer was pattern-wise irradiated with electron beams on an electron beam exposure machine (Model HL-750D, manufactured by Hitachi Ltd.) immediately followed by a post-exposure baking treatment at 120° C. for 90 seconds and then by a development treatment in a 2.38% by weight aqueous solution of tetramethylammonium hydroxide at 23° C. for 65 seconds followed by rinse with water for 30 seconds and drying. By conducting the electron beam exposure with different exposure doses, the minimum dose in $\mu C/cm^2$ was recorded as a measure of the sensitivity by which the resist layer was completely dissolved away in the development treatment on the exposed areas. The sensitivity in this case was 7.0 $\mu C/cm^2$.

The pattern resolution in the hole-patterned resist layer was 0.30 $\mu m$. The cross sectional profile of the patterned resist layer as examined on a scanning electron microscopic photograph was excellently orthogonal standing upright on the substrate surface.

EXAMPLE 2

A second chemical-sensitization positive-working resist composition was prepared in the same formulation as in the resist composition in Example 1 excepting for the replacement of the acid-generating agent with 3 parts by weight of α-(2-naphthylsulfonyloxyimino)-4-methoxybenzyl cyanide prepared in Preparation 2.

Evaluation of the thus prepared resist composition was undertaken in the same manner as in Example 1 to find that the sensitivity and pattern resolution thereof were 7.0 $\mu C/cm^2$ and 0.30 $\mu m$, respectively. The cross sectional profile of the hole-patterned resist layer as examined on a scanning electron microscopic photograph was also excellently orthogonal standing upright on the substrate surface.

EXAMPLE 3

A third chemical-sensitization positive-working resist composition was prepared in the same formulation as in the resist composition in Example 1 excepting for the replacement of the acid-generating agent with 3 parts by weight of α-(10-camphorsulfonyloxyimino)-4-methoxybenzyl cyanide prepared in Preparation 3.

Evaluation of the thus prepared resist composition was undertaken in the same manner as in Example 1 to find that the sensitivity and pattern resolution thereof were 9.0 $\mu C/cm^2$ and 0.30 $\mu m$, respectively. The cross sectional profile of the hole-patterned resist layer as examined on a scanning electron microscopic photograph was also excellently orthogonal standing upright on the substrate surface.

EXAMPLE 4

The experimental procedure was just the same as in Example 1 except that the resist layer was pattern-wise exposed to X-rays instead of the pattern-wise scanning with electron beams. The sensitivity and pattern resolution of the resist composition were 80 $mJ/cm^2$ and 0.25 $\mu m$, respectively. The cross sectional profile of the hole-patterned resist layer as examined on a scanning electron microscopic photograph was also excellently orthogonal standing upright on the substrate surface.

COMPARATIVE EXAMPLE

A comparative chemical-sensitization positive-working resist composition was prepared in the same formulation as in the resist composition in Example 1 excepting for the replacement of the acid-generating agent with 3 parts by weight of α-(benzenesulfonyloxyimino)-4-methoxybenzyl cyanide.

Evaluation of the thus prepared comparative resist composition was undertaken in the same manner as in Example 1 to find that the sensitivity and pattern resolution thereof were 10.0 $\mu C/cm^2$ and 0.36 $\mu m$, respectively. The cross sectional profile of the hole-patterned resist layer as examined on a scanning electron microscopic photograph was not orthogonal but trapezoidal narrowing upwardly.

EXAMPLE 5

A chemical-sensitization positive-working resist composition was prepared by dissolving, in 400 parts by weight of propyleneglycol monomethyl ether acetate, 10 parts by weight of a first polyhydroxystyrene resin having a weight-average molecular weight of 12000 with a molecular weight distribution expressed by $M_w:M_n$ of 4.6, which was substituted by tert-butyloxycarbonyl groups for 28% of the hydroxyl groups, 90 parts by weight of a second polyhydroxystyrene resin having a weight-average molecular weight of 12000 with a molecular weight distribution expressed by $M_w:M_n$ of 4.6, which was substituted by ethoxyethyl groups for 28% of the hydroxyl groups, 3 parts by weight of α-(1-naphthylsulfonyloxyimino)-4-methoxybenzyl cyanide prepared in Preparation 1 described above, 5 parts by weight of bis(p-tert-butylphenyl)iodonium trifluoromethane sulfonate, 0.06 part by weight of triethylamine and 0.06 part by weight of salicylic acid followed by filtration of the solution through a membrane filter having a pore diameter of 0.2 $\mu m$.

A semiconductor silicon wafer was coated on a spinner with the thus prepared positive-working resist solution followed by drying on a hot plate at 90° C. for 90 seconds to give a dried resist layer having a thickness of 0.7 $\mu m$. This resist layer was pattern-wise irradiated with electron beams on an electron beam exposure machine (Model HL-750D, manufactured by Hitachi Ltd.) immediately followed by a post-exposure baking treatment at 110° C. for 90 seconds and then by a development treatment in a 2.38% by weight aqueous solution of tetramethylammonium hydroxide at 23° C. for 65 seconds followed by rinse with water for 30 seconds and drying. By conducting the electron beam exposure with different exposure doses, the minimum dose in $\mu C/cm^2$ was recorded as a measure of the sensitivity by which the resist layer was completely dissolved away in the development treatment on the exposed areas. The sensitivity in this case was 7.0 $\mu C/cm^2$.

The pattern resolution in the hole-patterned resist layer was 0.14 $\mu m$. The cross sectional profile of the patterned resist layer as examined on a scanning electron microscopic photograph was excellently orthogonal standing upright on the substrate surface.

EXAMPLE 6

The experimental procedure was substantially the same as in Example 5 except that the resist layer on the substrate surface was pattern-wise exposed to X-rays instead of pattern-wise irradiation by electron beam scanning. The sensitivity in this case was 70 $mJ/cm^2$ and the pattern resolution was 0.15 $\mu m$. The cross sectional profile of the patterned resist layer as examined on a scanning electron microscopic photograph was excellently orthogonal standing upright on the substrate surface.

EXAMPLE 7

A chemical-sensitization negative-working resist composition was prepared by dissolving, in 585 parts by weight of propyleneglycol monomethyl ether acetate, 100 parts by weight of a copolymeric resin of p-hydroxystyrene and styrene in a molar ratio of 85:15 having a weight-average molecular weight of 2500 with a molecular weight distribution expressed by $M_w:M_n$ of 1.23 and 10 parts by weight of a melamine resin (Nikalac Mw-30, a product by Sanwa Chemical Co.) to give a solution which was admixed with 4 parts by weight of α-(1-naphthylsulfonyloxyimino)-4-methoxybenzyl cyanide prepared in Preparation 1 described above and 2 parts by weight of α-(methylsulfonyloxyimino)-1-benzyl cyanide and then with 2 parts by weight of 2,2',4,4'-tetrahydroxy benzophenone.

A semiconductor silicon wafer was coated on a spinner with the thus prepared negative-working resist solution followed by drying on a hot plate at 100° C. for 90 seconds to give a dried resist layer having a thickness of 0.73 μm. This resist layer was pattern-wise exposed to excimer laser beams on the minifying projection exposure machine (Model NSR-2005EX8A, manufactured by Nikon Co.) followed by a post-exposure baking treatment at 120° C. for 90 seconds and then the resist layer was subjected to a development treatment in a 2.38% by weight aqueous solution of tetramethylammonium hydroxide at 23° C. for 65 seconds followed by rinse with water for 30 seconds and drying. By conducting the excimer laser beam exposure with different exposure doses, the minimum dose, by which a line- and-space resist pattern of 0.35 μm line width could be formed in a 1:1 line to space ratio, in mJ/cm² was recorded as a measure of the sensitivity. The sensitivity in this case was 38 mJ/cm². The pattern resolution, which was the critical resolution at an exposure dose for reproduction of a line-and-space photomask pattern of 0.35 μm line width, was 0.23 μm.

The cross sectional profile of the patterned resist layer of 0.35 μm line width as examined on a scanning electron microscopic photograph was excellently orthogonal standing upright on the substrate surface. Although slight waviness was found on the side lines of the cross sectional profile, the cross section was not trapezoidal narrowing upwardly.

EXAMPLE 8

A chemical-sensitization negative-working resist composition was prepared by dissolving, in 500 parts by weight of propyleneglycol monomethyl ether acetate, 100 parts by weight of a copolymeric resin of p-hydroxystyrene and styrene in a molar ratio of 85:15 having a weight-average molecular weight of 2500 with a molecular weight distribution expressed by $M_w:M_n$ of 1.23 and 10 parts by weight of a melamine resin (Nikalac Mw-100LM, a product by Sanwa Chemical Co.) to give a solution, in which 2 parts by weight of α-(10-camphorsulfonyloxyimino)-4-methoxybenzyl cyanide prepared in Preparation 3 described above and 2 parts by weight of α-(methylsulfonyloxyimino)-4-methylbenzyl cyanide were dissolved and then 1 part by weight of 2,2',4,4'-tetrahydroxy benzophenone, 0.25 part by weight of triethylamine, 0.25 part by weight of tributylamine and 0.5 part by weight of salicylic acid were dissolved.

A semiconductor silicon wafer was coated on a spinner with the thus prepared negative-working resist solution followed by drying on a hot plate at 100° C. for 90 seconds to give a dried resist layer having a thickness of 0.73 μm. This resist layer was pattern-wise exposed to excimer laser beams on the minifying projection exposure machine (Model NSR-2005EX8A, manufactured by Nikon Co.) followed by a post-exposure baking treatment at 120° C. for 90 seconds and then the resist layer was subjected to a development treatment in a 2.38% by weight aqueous solution of tetramethylammonium hydroxide at 23° C. for 65 seconds followed by rinse with water for 30 seconds and drying. The exposure dose corresponding to the sensitivity of the resist composition was 37 mJ/cm² and the pattern resolution was 0.22 μm.

The cross sectional profile of the patterned resist layer of 0.35 μm line width as examined on a scanning electron microscopic photograph was excellently orthogonal standing upright on the substrate surface as in Example 7.

EXAMPLE 9

A chemical-sensitization positive-working resist composition was prepared by dissolving, in 400 parts by weight of propyleneglycol monomethyl ether acetate, 30 parts by weight of a first polyhydroxystyrene resin having a weight-average molecular weight of 10000, which was substituted by tetrahydropyranyl groups for 40% of the hydroxyl groups, 70 parts by weight of a second polyhydroxystyrene resin having a weight-average molecular weight of 10000, which was substituted by 1-ethoxyethyl groups for 40% of the hydroxyl groups, 5 parts by weight of bis (cyclohexylsulfonyl) diazomethane, 1 part by weight of bis(p-tert-butylphenyl)iodonium trifluoromethane sulfonate and 1 part by weight of α-(1-naphthylsulfonyloxyimino)-4-methoxybenzyl cyanide prepared in Preparation 1 described above followed by filtration of the solution through a membrane filter of 0.2 μm pore diameter.

A semiconductor silicon wafer was coated on a spinner with the thus prepared positive-working resist solution followed by drying on a hot plate at 90° C. for 90 seconds to give a dried resist layer having a thickness of 0.7 μm. This resist layer was pattern-wise exposed to excimer laser beams on the minifying projection exposure machine (Model NSR-2005EX8A, manufactured by Nikon Co.) immediately followed by a post-exposure baking treatment at 110° C. for 90 seconds and then the resist layer was subjected to a development treatment in a 2.38% by weight aqueous solution of tetramethylammonium hydroxide at 23° C. for 60 seconds followed by rinse with water for 30 seconds and drying. The exposure dose, by which the resist layer in the exposed areas was completely dissolved away, corresponding to the sensitivity of the resist composition was 5 mJ/cm².

The cross sectional profile of the patterned resist layer of 0.25 μm line width as examined on a scanning electron microscopic photograph was excellently orthogonal without waviness along the side lines and without upward narrowing though slightly trapezoidal.

What is claimed is:

1. An oximesulfonate compound represented by the general formula $$R^6—C(CN)=N—O—SO_2—R^7,$$

in which $R^6$ is a monovalent aromatic cyclic group and $R^7$ is a naphthyl group or a camphor residue.

2. The oximesulfonate compound as claimed in claim 1 in which the monovalent aromatic cyclic group is selected from the group consisting of unsubstituted or substituted phenyl group, naphthyl group, furyl group and thienyl group.

3. The oximesulfonate compound as claimed in claim 2, wherein the monovalent aromatic cyclic group is a phenyl or alkoxyphenyl group.

4. The oximesulfonate compound as claimed in claim 3, wherein the alkoxyphenyl group is a 4-methoxyphenyl group.

5. The oximesulfonate compound as claimed in claim 1, wherein $R^7$ is a naphthyl group.

6. The oximesulfonate compound as claimed in claim 1, wherein $R^7$ is a 3-camphor residue or 10-camphor residue.

7. An oxime sulfonate compound which is; α-(-naphthylsulfonyloxyimino)-4-methoxybenzyl cyanide of the formula

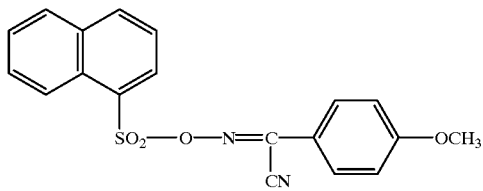

α-(2-naphthylsulfonyloxyimino)-4-methoxybenzyl cyanide of the formula

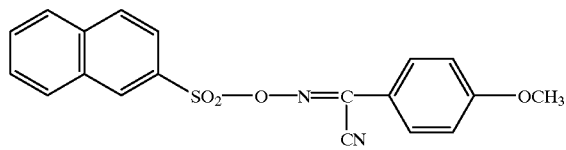

α-(10-camphorsulfonyloxyimino)-4-methoxybenzyl cyanide of the formula

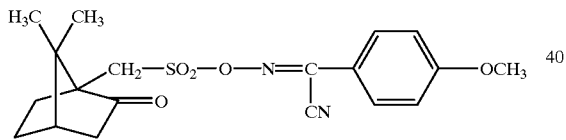

α-naphthylsulfonyloxyimino)benzyl cyanide of the formula

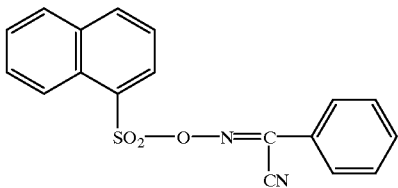

α-(2-naphthylsulfonyloxyimino)benzyl cyanide of the formula

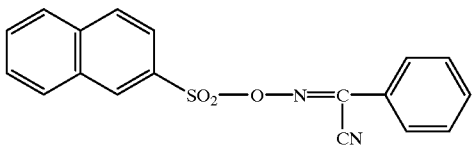

α-(10-camphorsulfonyloxyimino)benzyl cyanide of the formula

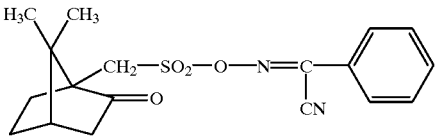

or
α-(3-camphorsulfonyloxyimino)-4-methoxybenzyl cyanide of the formula

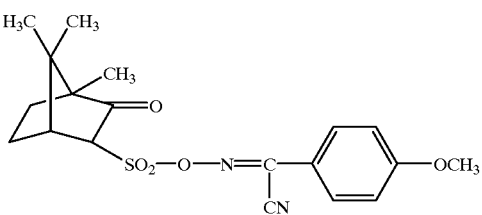

* * * * *

UNITED STATES PATENT AND TRADEMARK OFFICE
CERTIFICATE OF CORRECTION

PATENT NO. : 6,245,930 B1
DATED : June 12, 2001
INVENTOR(S) : Katsumi Oomori et al.

Page 1 of 1

It is certified that error appears in the above-identified patent and that said Letters Patent is hereby corrected as shown below:

Column 23, claim 7,
Line 9, change "α-(-" to -- α-(1- --.

Column 24, claim 7,
Line 1, change "α-naphthylsulfonyloxyimino)benzyl cyanide" to
-- α-(1-naphthylsulfonyloxyimino)benzyl cyanide --

Signed and Sealed this

Twelfth Day of March, 2002

Attest:

Attesting Officer

JAMES E. ROGAN
Director of the United States Patent and Trademark Office

UNITED STATES PATENT AND TRADEMARK OFFICE
Certificate

Patent No. 6,245,930 B1                                                Patented: June 12, 2001

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Katsumi Oomori, Yokohama, Hiratsuka, Japan; Hideo Hada, Hiratsuka, Japan; Toshimasa Nakayama, Chigasaki, Japan.

Signed and Sealed this Eleventh Day of March 2003.

*JANET C. BAXTER*
*Supervisory Patent Examiner*
Art Unit 1752